(12) United States Patent
Prasad et al.

(10) Patent No.: US 12,341,032 B2
(45) Date of Patent: Jun. 24, 2025

(54) METHODS OF SELECTIVE OXIDATION ON RAPID THERMAL PROCESSING (RTP) CHAMBER WITH ACTIVE STEAM GENERATION

(71) Applicant: Applied Materials, Inc., Santa Clara, CA (US)

(72) Inventors: Chaitanya Anjaneyalu Prasad, Cupertino, CA (US); Christopher Sean Olsen, Fremont, CA (US); Lara Hawrylchak, Gilroy, CA (US); Erika Gabrielle Hansen, San Jose, CA (US); Daniel C. Glover, Danville, CA (US); Naman Apurva, Patna (IN); Tsung-Han Yang, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/653,955

(22) Filed: May 2, 2024

(65) Prior Publication Data

US 2024/0282601 A1    Aug. 22, 2024

Related U.S. Application Data

(62) Division of application No. 17/362,760, filed on Jun. 29, 2021, now Pat. No. 11,996,305.

(51) Int. Cl.
*H01L 21/67* (2006.01)
*H01L 21/02* (2006.01)

(52) U.S. Cl.
CPC .. *H01L 21/67115* (2013.01); *H01L 21/02238* (2013.01)

(58) Field of Classification Search
None
See application file for complete search history.

(56) References Cited

U.S. PATENT DOCUMENTS 6,051,512 A * 4/2000 Sommer ........... H01L 21/67748
219/390
6,349,887 B1    2/2002 Pyo
(Continued)

FOREIGN PATENT DOCUMENTS

JP    2002-124512 A    4/2002
JP    2003-163168 A    6/2003
(Continued)

OTHER PUBLICATIONS

International Search Report for PCT/US2022/035364, dated Oct. 28, 2022.

*Primary Examiner* — Alexander G Ghyka
(74) *Attorney, Agent, or Firm* — Moser Taboada

(57) ABSTRACT

Embodiments of methods of performing a selective oxidation process on non-metal surfaces are provided herein. In some embodiments, a method of performing a selective oxidation process on non-metal surfaces includes: forming a first mixture of a carrier gas and a liquid in a mixer having a mixing block coupled to one or more control valves with a mixing line disposed therebetween; flowing the first mixture from the mixer to a vaporizer to vaporize the first mixture outside of an RTP chamber; and delivering the vaporized first mixture to the RTP chamber via a gas delivery line to expose a substrate disposed in the RTP chamber with the vaporized first mixture to perform a selective oxidation process on the substrate at a temperature of about 500 to about 1100 degrees Celsius.

13 Claims, 5 Drawing Sheets

(56) References Cited

U.S. PATENT DOCUMENTS

| | | | |
|---|---|---|---|
| 6,596,085 B1 | 7/2003 | Schmitt et al. | |
| 8,546,271 B2 | 10/2013 | Yokota et al. | |
| 9,514,968 B2 * | 12/2016 | Tjandra | H01L 21/67248 |
| 2002/0045358 A1 | 4/2002 | Weimer et al. | |
| 2002/0172756 A1 | 11/2002 | Joo et al. | |
| 2003/0222360 A1 | 12/2003 | Randive et al. | |
| 2009/0233429 A1 | 9/2009 | Ishikawa et al. | |

FOREIGN PATENT DOCUMENTS

| | | |
|---|---|---|
| WO | WO 2001-082350 A1 | 11/2001 |
| WO | WO 2004/070074 A2 | 8/2004 |

* cited by examiner

METHODS OF SELECTIVE OXIDATION ON RAPID THERMAL PROCESSING (RTP) CHAMBER WITH ACTIVE STEAM GENERATION

CROSS-REFERENCE TO RELATED APPLICATIONS

This application is a divisional of co-pending U.S. patent application Ser. No. 17/362,760, filed Jun. 29, 2021, the entirety of which is incorporated herein by reference.

FIELD

Embodiments of the present disclosure generally relate to substrate processing equipment.

BACKGROUND

Oxidation of silicon is a fundamental technology in the fabrication of an integrated circuit (IC). Advanced integrated circuit fabrication requires a number of process steps where thin films of silicon oxide are grown on silicon or polysilicon structures. For some applications, the oxidation process must be selective, such that other materials including metals are not oxidized. The most common methods for oxidation of silicon rely on thermal processes in ambient of $O_2$, $H_2O/H_2$, $H_2O/O_2$, $O_2/H_2$, or combinations thereof. The hardware used to provide the silicon oxidation process in IC fabrication typically comprises of thermal processing chambers. Steam oxidation processes typically promote oxide growth quicker than wet and dry oxidation processes. However, conventional steam oxidation processes do not provide good control over oxide growth rate, uniformity, selectivity, and conformality.

Thus, the inventors have provided improved apparatus and methods for selective oxidation of non-metals in the presence of metals on a substrate.

SUMMARY

Embodiments of methods of performing a selective oxidation process on non-metal surfaces are provided herein. In some embodiments, a method of performing a selective oxidation process on non-metal surfaces includes: forming a first mixture of a carrier gas and a liquid in a mixer having a mixing block coupled to one or more control valves with a mixing line disposed therebetween, wherein the mixing block includes a first inlet for a first liquid line that provides the liquid into the mixing line, a second inlet for a first carrier gas line that provides the carrier gas into the mixing line, and an outlet for the first mixture that extends from the mixing line; flowing the first mixture from the mixer to a vaporizer to vaporize the first mixture outside of an RTP chamber; and delivering the vaporized first mixture to the RTP chamber via a gas delivery line to expose a substrate disposed in the RTP chamber with the vaporized first mixture to perform a selective oxidation process on the substrate at a temperature of about 500 to about 1100 degrees Celsius.

In some embodiments, a method of performing a selective oxidation process on non-metal surfaces includes: mixing a carrier gas with a liquid in a desired ratio in a mixer to form a first mixture; flowing the first mixture to a vaporizer to vaporize the first mixture; and delivering the vaporized first mixture to an RTP chamber via a gas delivery line to expose a substrate disposed in the RTP chamber with the vaporized first mixture to perform a selective oxidation process on the substrate at a temperature of about 500 to about 1100 degrees Celsius.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
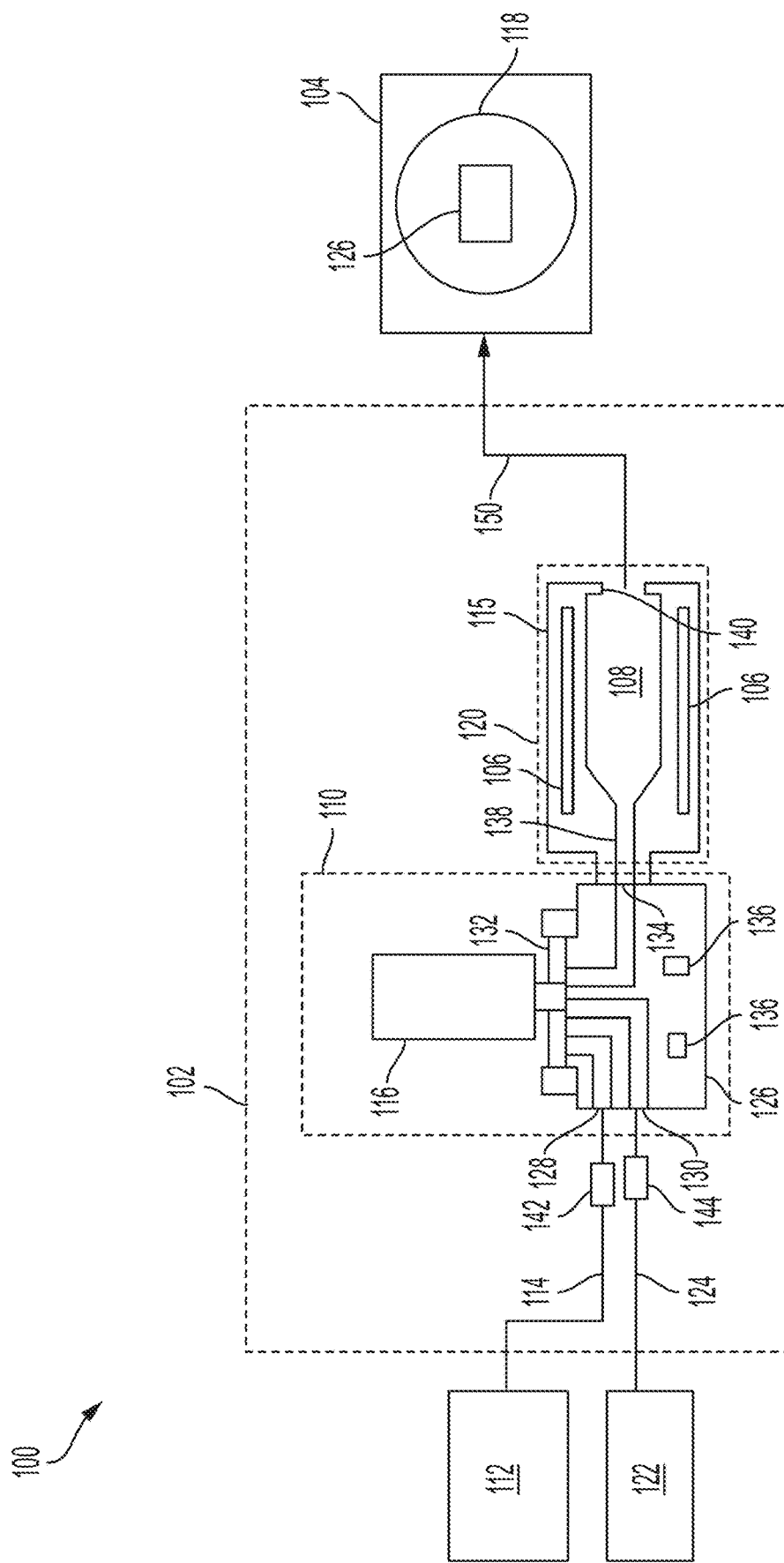
FIG. 1 depicts a schematic view of a rapid thermal processing system in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The apparatus and methods provided herein are directed to a rapid thermal processing (RTP) system that facilitates selective oxidation of non-metal surfaces in an RTP chamber using one or more vaporized mixtures. The RTP system includes a gas distribution module that is configured to form the one or more vaporized mixtures. The gas distribution module generally includes respective mixers and vaporizers to form the one or more vaporized mixtures. In some embodiments, one or more of the vaporized mixtures may comprise a carrier gas such as hydrogen mixed with steam. As such, the RTP system provided herein advantageously allows for direct steam injection into the RTP chamber. One or more of the vaporized mixtures include active gases that can be used for selective oxidation of silicon or for metal oxide densification. The one or more vaporized mixtures may be heated to high temperatures (>500 degrees Celsius) during processing in the RTP chamber. The RTP chamber may be pressurized to high pressures (>100 Torr) during processing. The gas distribution module controls the composition (e.g., carrier gas to steam ratio) and flow rates of the one or more vaporized mixtures delivered to the RTP chamber to provide tuning knobs for oxide growth rate, uniformity, selectivity, and conformality.

FIG. 1 depicts a schematic view of a rapid thermal processing (RTP) system 100 in accordance with at least some embodiments of the present disclosure. The RTP system 100 generally includes an RTP chamber 104 coupled to a gas distribution module 102 for supplying the RTP chamber 104 with one or more vaporized mixtures. A liquid source 112 and a carrier gas source 122 are coupled to the gas distribution module 102. In some embodiments, the liquid source 112 comprises water, such as deionized water, or any other suitable liquid. In some embodiments, the carrier gas source 122 comprises essentially of hydrogen, argon, nitrogen, or deuterium.

The liquid source 112 is fluidly coupled to the gas distribution module 102 via a first liquid line 114. The carrier gas source 122 is fluidly coupled to the gas distribution module 102 via a first carrier gas line 124. A first mass flow controller 142 (MFC) may be disposed along the first liquid line 114 to control a flow of the liquid to the gas distribution module 102. A second MFC 144 may be disposed along the first carrier gas line 124 to control a flow of the carrier gas to the gas distribution module 102. In some embodiments, the liquid may be provided at about 1 to about 5 gallons per minute. In some embodiments, the carrier gas may be provided at about 10 to about 30 liters per minute.

The gas distribution module 102 generally comprises a mixer 110 coupled to the first liquid line 114 and the first carrier gas line 124 and a vaporizer 120 coupled to the mixer 110. The mixer 110 is configured to mix liquid from the liquid source 112 and a carrier gas from the carrier gas source 122 in a desired ratio to form a first mixture. The vaporizer 120 coupled to the mixer 110 is configured to receive the first mixture in a hollow internal volume 108. The vaporizer 120 is configured to vaporize the first mixture, for example, into a gaseous mixture comprising the carrier gas from the carrier gas source 122 and steam.

In some embodiments, the mixer 110 includes one or more control valves 116 configured to mix the carrier gas from the first carrier gas line 124 and the liquid from the first liquid line 114 in a desired ratio to form the first mixture. In some embodiments, the mixer 110 includes a mixing block 126 having a first inlet 128 fluidly coupled to the first liquid line 114 and a second inlet 130 coupled to the first carrier gas line 124. In some embodiments, the first inlet 128 and the second inlet 130 extend to a mixing line 132 of the mixer 110. The mixer 110 includes an outlet 134. In some embodiments, the mixing block 126 includes the outlet 134 and the outlet 134 extends from the mixing line 132 to an outer sidewall of the mixing block 126. In some embodiments, the outer sidewall of the mixing block 126 that the outlet 134 extends to is disposed facing the vaporizer 120. In some embodiments, the one or more control valves 116 are coupled to the mixing line 132 and configured to control a flow of the first mixture through the outlet 134.

In some embodiments, the mixer 110 includes one or more heating elements 136. In some embodiments, the one or more heating elements 136 are disposed in the mixing block 126. In some embodiments, the one or more heating elements 136 are disposed in the mixing block 126 below the mixing line 132. In some embodiments, the one or more heating elements 136 are configured to heat the first mixture to a temperature of about 100 to about 150 degrees Celsius.

The vaporizer 120 includes a vaporizer heater 106 configured to vaporize the first mixture, for example, into steam. In some embodiments, the vaporizer 120 includes an inlet 138 fluidly coupled to the outlet 134 of the mixer 110. In some embodiments, the inlet 138 may be directly coupled to the outlet 134 to reduce or prevent heat loss from the first mixture as the first mixture flows from the mixer 110 to the vaporizer 120. In some embodiments, a conduit may be disposed between the outlet 134 of the mixer 110 and the inlet 138 of the vaporizer 120. In some embodiments, the conduit between the outlet 134 and the inlet 138 may be heated to about 100 to about 150 degrees Celsius.

In some embodiments, the inlet 138 extends to the hollow internal volume 108 of the vaporizer 120. In some embodiments, the vaporizer 120 includes an outlet 140 extending from a side of the hollow internal volume 108 opposite the inlet 138. In some embodiments, the vaporizer 120 comprises a vaporizer block 115 disposed about the hollow internal volume 108. In some embodiments, the hollow internal volume 108, the inlet 138, and the outlet 140 are formed in the vaporizer block 115. In some embodiments, the vaporizer heater 106 is disposed in the vaporizer block 115. The vaporizer heater 106 may be configured to heat the first mixture to a temperature of about 120 to about 200 degrees Celsius. In some embodiments, the hollow internal volume 108 increases in cross-sectional area from the inlet 138 towards the outlet 140 to accommodate for the expansion of the first mixture as the first mixture vaporizes.

The outlet 140 of the vaporizer 120 is fluidly coupled to a first gas delivery line 150 disposed between the vaporizer 120 and the RTP chamber 104 to deliver the vaporized first mixture to the RTP chamber 104. In some embodiments, the first gas delivery line 150 includes a heater jacket to maintain the vaporized first mixture at a temperature of about 60 to about 120 degrees Celsius.

The RTP chamber 104, as described in more detail below, generally includes a substrate support 118 for supporting a substrate and a radiative heat source 160 for heating the substrate. The RTP chamber 104 is configured to perform a selective oxidation process via a thermal process, without including a plasma source, such as a remote plasma source. The RTP chamber 104 may be configured to heat the substrate at a temperature range of about 500 to 1100 Celsius during processing. The RTP chamber 104 may be pressurized to high pressures of about 100 to about 600 Torr during processing.

Figure 2:
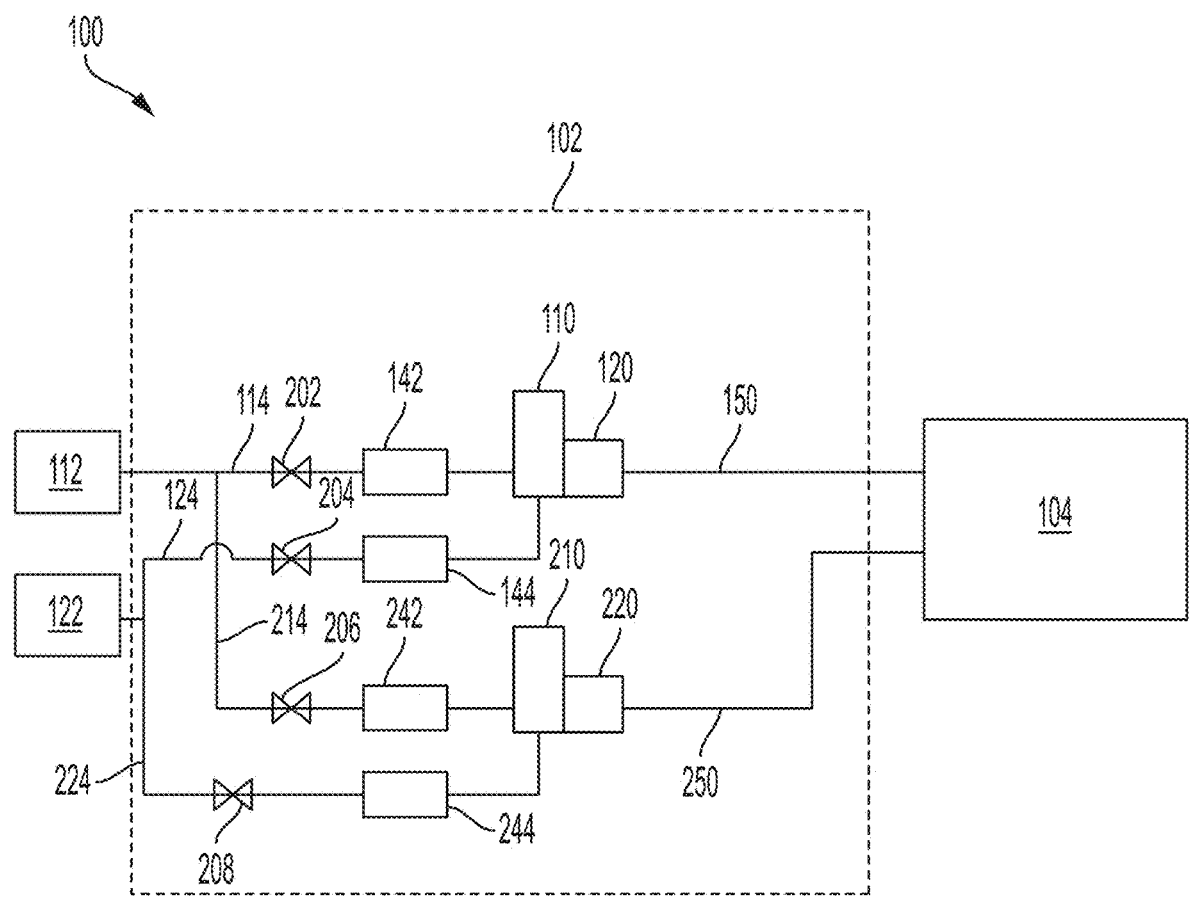
FIG. 2 depicts a schematic view of a rapid thermal processing system in accordance with at least some embodiments of the present disclosure.

FIG. 2 depicts a schematic view of a rapid thermal processing system 100 in accordance with at least some embodiments of the present disclosure. In some embodiments, the gas distribution module 102 include a plurality of mixers and a plurality of associated vaporizers. The plurality of mixers may advantageously allow for different compositions of gaseous mixtures, different carrier gas to steam ratios of the gaseous mixtures, or the like, provided to the RTP chamber 104. For example, as depicted in FIG. 2, the gas distribution module 102 further comprises a second mixer 210 configured to mix liquid from the liquid source 112 and carrier gas from the carrier gas source 122 in a desired ratio to form a second mixture and a second vaporizer 220 configured to vaporize the second mixture. The second vaporizer 220 is fluidly coupled to the RTP chamber 104 via a second gas delivery line 250 for delivering the second mixture that is vaporized to the RTP chamber 104. In some embodiments, the second mixer 210 and the second vaporizer 220 may be similar to the mixer 110 and the vaporizer 120 described above with respect to FIG. 1.

As shown in FIG. 2, the liquid source 112 and the carrier gas source 122 are common between the mixer 110 and the second mixer 210, allowing for the mixer 110 and the second mixer 210 to advantageously provide different carrier gas to liquid ratios for the first mixture and the second mixture to control oxide growth rate, uniformity, selectivity, and conformality. In such embodiments, a second carrier gas line 224 may extend from the first carrier gas line 124 to the second mixer 210. A second liquid line 214 may extend from the first liquid line 114 to the second mixer 210. In other embodiments, the mixer 110 and the second mixer 210 may be fluidly coupled to separate liquid and carrier gas sources, or a same liquid source but different carrier gas sources, to provide different gaseous mixtures to the RTP chamber 104. For example, the multiple carrier gas sources can provide two different reactive gases, one reactive gas and one purge gas, or the like. A third MFC 242 may be disposed along the second liquid line 214 to control a flow of liquid to the second mixer 210. A fourth MFC 244 may be disposed along the second carrier gas line 224 to control a flow of carrier gas to the second mixer 210.

The first liquid line 114 may include a first control valve 202 upstream from the first MFC 142 to control flow to the first MFC 142. The first carrier gas line 124 may include a second control valve 204 upstream from the second MFC 144 to control flow to the second MFC 144. The second liquid line 214 may include a third control valve 206 upstream from the third MFC 242 to control flow to the third MFC 242. The second carrier gas line 224 may include a fourth control valve 208 upstream from the fourth MFC 244 to control flow to the fourth MFC 244.

Figure 3:
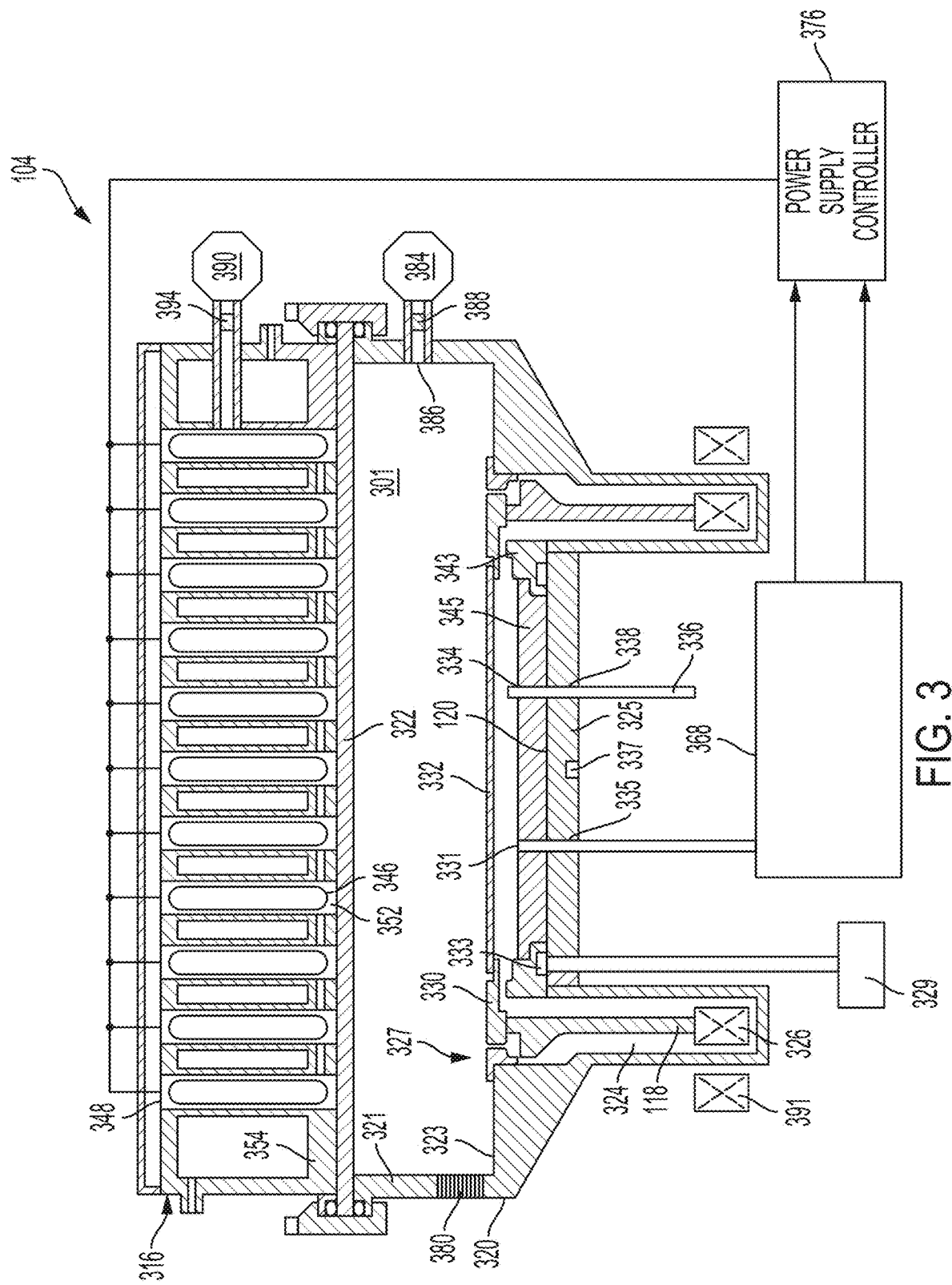
FIG. 3 depicts a schematic side view of a rapid thermal processing chamber in accordance with at least some embodiments of the present disclosure.

FIG. 3 depicts a schematic side view of a RTP chamber 104 in accordance with at least some embodiments of the present disclosure. The RTP chamber 104 generally includes a chamber body 320 having a first portion 321 and a second portion 323, and a window 322 disposed on the first portion 321 of the chamber body 320. The chamber body 320 and the window 322 define a processing volume 301 therein. A lamp assembly 316 is disposed on the window 322. The lamp assembly 316 may be the radiative heat source 160 of FIG. 1. The lamp assembly 316 includes a housing 354 and a plurality of openings 352 formed in the housing 354. A plurality of lamps 346 are disposed in the housing 354, and each lamp 346 is disposed within a corresponding opening 352. The lamps 346 are connected to a power supply controller 376 via a plurality of electrical sockets 348. During operation, the plurality of lamps 346 emit radiation through the window 322 toward a substrate 332 disposed in the RTP chamber 104 to heat the substrate 332 to a predetermined temperature. The predetermined temperature may range from about 20 to about 1,500 degrees Celsius, for example about 500 to 1000 degrees Celsius.

The window 322 is generally made of any material resistant to the processing environment and transmissive to the desired radiation. For example, quartz is typically used for the window 322 since quartz is transparent to infrared light. Other suitable materials may include, but are not limited to, sapphire. In further examples, the window 322 is optionally coated with an anti-reflective coating or any other suitable filters, on one or both sides of the window 322.

A gas delivery port 380 is formed in the first portion 321 of the chamber body 320. The gas delivery port 380 is fluidly coupled to the first gas delivery line 150 for introducing the first mixture into the processing volume 301. During operation, a vacuum pump 384 evacuates the RTP chamber 104 by pumping through an exhaust port 386 formed in the first portion 321 of the chamber body 320. In some embodiments, a valve 388 disposed between the exhaust port 386 and the vacuum pump 384 may be used to control the pressure within the RTP chamber 104. In some embodiments, a second vacuum pump 390 is connected to the lamp assembly 316 to control a pressure within the lamp assembly 316. The pressure within the lamp assembly 316 is controlled by a valve 394.

In some embodiments, a channel 324 is formed in the chamber body 320 and a rotor 326 is disposed in the channel 324. The channel 324 may be annular. In some embodiments, the channel 324 is located adjacent the second portion 323 of the chamber body 320. The RTP chamber 104 further includes the substrate support 118 that is rotatable. In some embodiments, the substrate support 118 is disposed in the channel 324. In some embodiments, an edge ring 330 is disposed on the substrate support 118 for supporting the substrate 332. In some embodiments, a shield 327 is disposed on the second portion 323 of the chamber body 320 and surrounds the edge ring 330 to provide a rotor cover. The substrate support 118 is fabricated from a material having high heat resistivity, such as black quartz. In some embodiments, the substrate support 118 is a cylinder.

In some embodiments, the substrate 332, such as a silicon substrate, is disposed on the edge ring 330 during operation. In some embodiments, a stator 391 is located external to the chamber body 320 in a position axially aligned with the rotor 326. In some embodiments, the stator 391 is a magnetic stator, and the rotor 326 is a magnetic rotor. During operation, the rotor 326 rotates, which in turn rotates the substrate support 118, the edge ring 330, and the substrate 332.

In order to cool the edge ring 330, a cooling member 343 may be disposed on a chamber bottom 325 and is in proximity to the edge ring 330. In some embodiments, the cooling member 343 is in direct contact with the chamber bottom 325. A thickness of the edge ring 330 may be over-specified to provide extra thermal mass. Such an edge support can act as a heat sink, which helps avoid overheating at the edge of the substrate 332. The chamber bottom 325 includes a channel 337 formed therein for a coolant to flow therethrough. In some embodiments, the coolant is water. The cooling member 343 may be fabricated from a material having high heat conductivity, such as a metal, for example, aluminum. In some embodiments, the cooling member 343 includes a recess 333 formed in a surface that is in contact with the chamber bottom 325. A purge gas may be flowed from a purge gas source 329 through the chamber bottom 325 and through the recess 333 of the cooling member 343 to provide convective cooling to the edge ring 330. The purge gas may be helium, nitrogen, or other suitable gas.

In some embodiments, a reflector plate 345 is disposed on the chamber bottom 325 and surrounded by the cooling member 343. The reflector plate 345 includes a first plurality of openings 331 and a second plurality of openings 334. A plurality of lift pins 336 extend through the second plurality of openings 334. The chamber bottom 325 includes a first plurality of openings 335 and a second plurality of openings 338. Each of the first plurality of openings 335 is aligned with a corresponding opening of the first plurality of openings 331, and each of the second plurality of openings 338 is aligned with a corresponding opening of the second plurality of openings 334.

The RTP chamber 104 may further include a detection assembly 368 having a plurality of thermal detectors. The plurality of thermal detectors are configured to measure a temperature profile across the substrate 332 via the first plurality of openings 331. The temperature profile may be sent to the power supply controller 376, which controls the power supplied to the lamps 346 in response to the measured temperature profile.

Figure 4:
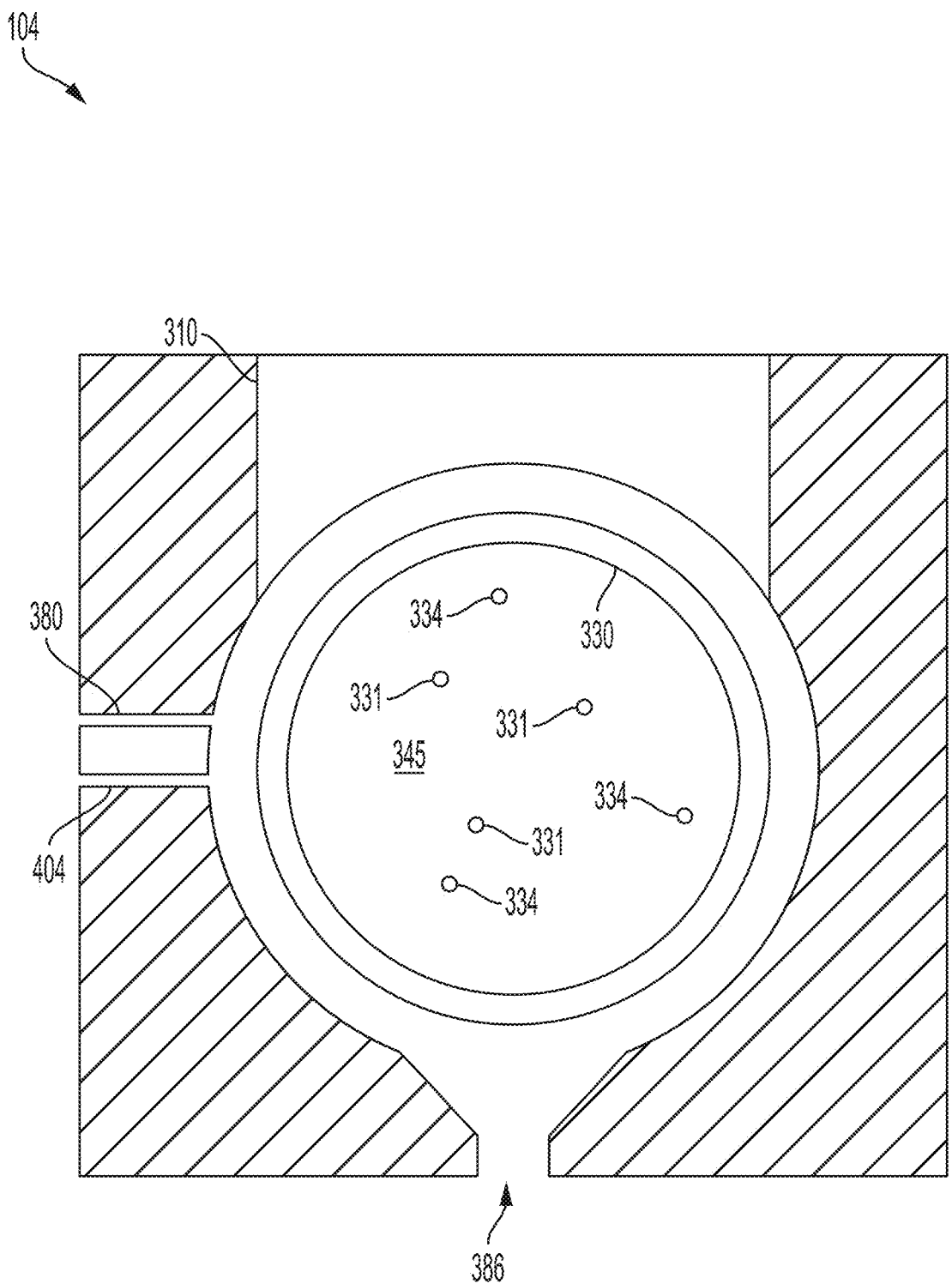
FIG. 4 depicts a schematic top cross-sectional view of a rapid thermal processing chamber in accordance with at least some embodiments of the present disclosure.

FIG. 4 depicts a schematic top cross-sectional view of a RTP chamber 104 in accordance with at least some embodiments of the present disclosure. The RTP chamber 104 further includes a slit valve 310 for transferring the substrate into and out of an interior volume of the RTP chamber 104. In some embodiments, the exhaust port 386 is disposed on a side of the RTP chamber 104 opposite the slit valve 310. In some embodiments, the RTP chamber 104 includes a gas delivery port 380 on a sidewall of the RTP chamber 104 corresponding with the first gas delivery line 150. In some embodiments, the RTP chamber 104 includes a second gas delivery port 404 on a sidewall of the RTP chamber 104 corresponding with the second gas delivery line 250. In some embodiments, as shown in FIG. 4, the gas delivery port 380 and the second gas delivery port 404 are disposed on a same sidewall of the RTP chamber 104. In some embodiments, the gas delivery port 380 is disposed orthogonal to the exhaust port 386.

Figure 5:
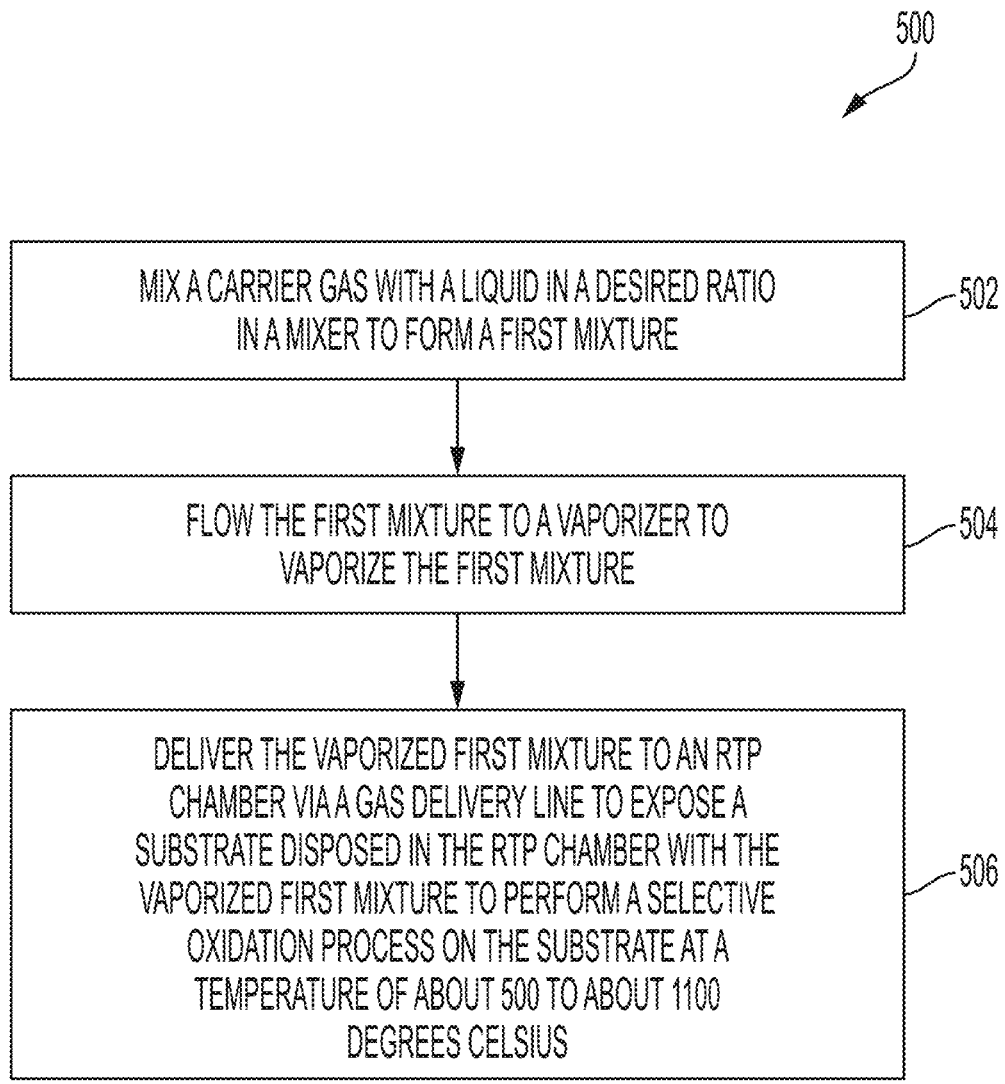
FIG. 5 depicts a method of performing a selective oxidation process on non-metal surfaces in accordance with at least some embodiments of the present disclosure.

FIG. 5 depicts a method 500 of performing a selective oxidation process on non-metal surfaces in accordance with at least some embodiments of the present disclosure. For example, performing a selective oxidation process on a silicon or oxide substrate. At 502, the method comprises mixing a carrier gas with a liquid in a desired ratio in a mixer (e.g., mixer 110) to form a first mixture. In some embodiments, the carrier gas is one or more of hydrogen, nitrogen, argon, or deuterium. In some embodiments, the first mixture is heated in the mixer via one or more heating elements (e.g., one or more heating elements 136). The liquid, for example, may be water.

At 504, the method comprises flowing the first mixture to a vaporizer (e.g., vaporizer 120) to vaporize the first mixture. The vaporizer includes a vaporizer heater 106 to vaporize the first mixture. At 506, the method comprises delivering the vaporized first mixture to an RTP chamber (e.g., RTP chamber 104) via a gas delivery line (e.g., first gas delivery line 150) to expose a substrate (e.g., substrate 332) disposed in the RTP chamber with the vaporized first mixture to perform a selective oxidation process on the substrate at a temperature of about 500 to about 1100 degrees Celsius. In some embodiments, the selective oxidation process selectively oxidizes silicon or densifies aluminum oxide. In some embodiments, the method includes heating the gas delivery line to about 60 to about 120 Celsius. In some embodiments, the selective oxidation process is performed in the RTP chamber at a pressure of about 100 to about 600 torr. In some embodiments, the first mixture is continuously heated from the mixer to the RTP chamber.

In some embodiments, the method 500 includes mixing a second carrier gas with a second liquid in a desired ratio in a second mixer (e.g., second mixer 210) to form a second mixture and flowing the first mixture to a second vaporizer (e.g., second vaporizer) to vaporize the second mixture. The vaporized second mixture may be delivered to the RTP chamber via a second gas delivery line (e.g., second gas delivery line 250) to perform the selective oxidation process on the substrate.

In some embodiments, the term "about" used herein, unless otherwise stated, may be within 15 percent of the stated value. While the foregoing is directed to embodiments of the present disclosure, other and further embodiments of the disclosure may be devised without departing from the basic scope thereof.

The invention claimed is:

1. A method of performing a selective oxidation process on non-metal surfaces, comprising:
    forming a first mixture of a carrier gas and a liquid in a mixer having a mixing block coupled to one or more control valves that are fluidly coupled with a mixing line disposed in the mixing block, wherein the mixing block includes a first inlet for a first liquid line that provides the liquid into the mixing line, a second inlet for a first carrier gas line that provides the carrier gas into the mixing line, and an outlet for the first mixture that extends from the mixing line to an outer sidewall of the mixing block;
    flowing the first mixture from the mixer to a vaporizer to vaporize the first mixture outside of an RTP chamber; and
    delivering the vaporized first mixture to the RTP chamber via a gas delivery line to expose a substrate disposed in the RTP chamber with the vaporized first mixture to perform the selective oxidation process on the substrate at a temperature of about 500 to about 1100 degrees Celsius.

2. The method of claim 1, wherein the carrier gas is one or more of hydrogen, nitrogen, argon, or deuterium.

3. The method of claim 1, further comprising heating the gas delivery line to about 60 to about 120 degrees Celsius.

4. The method of claim 1, wherein the selective oxidation process is performed in the RTP chamber at a pressure of about 100 to about 550 torr.

5. The method of claim 1, further comprising:
    mixing a second carrier gas with a second liquid in a second mixer to form a second mixture, wherein the second mixture is different than the first mixture;
    flowing the second mixture to a second vaporizer to vaporize the second mixture outside of the RTP chamber; and
    delivering the vaporized second mixture to the RTP chamber via a second gas delivery line to perform the selective oxidation process on the substrate.

6. The method of claim 1, wherein the selective oxidation process selectively oxidizes silicon or densifies aluminum oxide.

7. The method of claim 1, wherein the first mixture is continuously heated from the mixer to the RTP chamber.

8. The method of claim 1, wherein the liquid may be provided at about 1 to about 5 gallons per minute.

9. The method of claim 1, wherein the carrier gas may be provided at about 10 to about 30 liters per minute.

10. The method of claim 1, wherein the vaporizer is coupled to the mixer and configured to receive the first mixture in a hollow internal volume.

11. The method of claim 1, further comprising a first mass flow controller disposed along a first liquid line extending between a water supply and the mixer.

12. The method of claim 1, wherein the liquid is water, and wherein the vaporized first mixture comprises steam and the vaporized carrier gas.

13. The method of claim 1, wherein the gas delivery line extends to a first sidewall of the RTP chamber, and wherein the RTP chamber includes a second sidewall orthogonal to the first sidewall and having an exhaust port and a third sidewall opposite the second sidewall and having a slit valve for transferring the substrate.

* * * * *